US007956446B2

(12) United States Patent
Heinrich et al.

(10) Patent No.: US 7,956,446 B2
(45) Date of Patent: Jun. 7, 2011

(54) SEMICONDUCTOR DEVICE AND METHOD

(75) Inventors: Alexander Heinrich, Regensburg (DE); Klaus Schiess, Allensbach (DE); Joachim Mahler, Regensburg (DE)

(73) Assignee: Infineon Technologies AG, Neubiberg (DE)

( * ) Notice: Subject to any disclaimer, the term of this patent is extended or adjusted under 35 U.S.C. 154(b) by 309 days.

(21) Appl. No.: 12/119,665

(22) Filed: May 13, 2008

(65) Prior Publication Data

US 2009/0283879 A1    Nov. 19, 2009

(51) Int. Cl.
*H01L 23/495*    (2006.01)
(52) U.S. Cl. .... 257/666; 257/675; 257/676; 257/E21.51
(58) Field of Classification Search .................. 257/666, 257/675, 676, E21.51
See application file for complete search history.

(56) References Cited

U.S. PATENT DOCUMENTS

| 4,320,412 | A | 3/1982 | Hynes et al. |
| 4,996,115 | A * | 2/1991 | Eerkes et al. ................. 428/614 |
| 5,015,803 | A | 5/1991 | Mahulikar et al. |
| 2002/0172025 | A1 * | 11/2002 | Megahed et al. ............. 361/767 |
| 2006/0051895 | A1 * | 3/2006 | Abe et al. ...................... 438/108 |
| 2006/0055011 | A1 | 3/2006 | Carney et al. |
| 2008/0053523 | A1 * | 3/2008 | Brown et al. ................. 136/256 |

* cited by examiner

*Primary Examiner* — Thien F Tran
(74) *Attorney, Agent, or Firm* — Dicke, Billig & Czaja, P.L.L.C.

(57) ABSTRACT

A chip carrier includes first, second and third layers with the second layer situated between the first and third layers. The first and third layers are formed of a first material and the second layer is formed of a second material. The second layer has a plurality of holes extending therethrough and the first material fills the holes.

18 Claims, 4 Drawing Sheets

SEMICONDUCTOR DEVICE AND METHOD

BACKGROUND

Semiconductor devices, such as integrated circuit (IC) packages, typically include one or more semiconductor devices arranged on a lead frame or carrier. The semiconductor device is attached to the lead frame and bond wires or other electrical connections are attached to contacts on the semiconductor devices and to leads on the carrier to provide electrical interconnections between the various semiconductor devices and/or between a semiconductor device and the carrier. The device is then typically encapsulated in a plastic housing to provide protection and form a housing from which the leads extend.

The semiconductor device may be mounted on and electrically connected to the chip carrier, for example, by a diffusion soldering technique. Diffusion soldering has the advantage that the intermetallic phases of the bond produced have a higher melting point than the temperature at which the bond was produced. Therefore, the bond is stable during subsequent processing steps and, in particular, subsequent soft soldering processes.

Copper is a common material for lead frames. The high thermal coefficient of expansion (CTE) of the copper lead frame, however, can affect the accuracy of placement of small semiconductor devices on the lead frame when a diffusion soldering process is used, since the soldering procedure takes place at about 350° C., for example. When the lead frame cools, it contracts and thus can change the position of the semiconductor devices on the lead frame.

To address this, lead frames have been fabricated using materials with a lower CTE than copper, such as Alloy 42 or ceramic materials. However, these materials have a lower thermal conductivity than copper, and thus may not provide adequate heat dissipation.

SUMMARY

Embodiments of a semiconductor device including a chip carrier are disclosed. The chip carrier includes first, second and third layers with the second layer situated between the first and third layers. The first layer is formed of a first material, the second layer is formed of a second material and has a plurality of holes extending therethrough, the third layer formed of a third material and a fourth material fills the holes and is connected to the first layer and the third layer. A semiconductor chip is soldered to the first layer.

BRIEF DESCRIPTION OF THE DRAWINGS

The accompanying drawings are included to provide a further understanding of the present invention and are incorporated in and constitute a part of this specification. The drawings illustrate the embodiments of the present invention and together with the description serve to explain the principles of the invention. Other embodiments of the present invention and many of the intended advantages of the present invention will be readily appreciated as they become better understood by reference to the following detailed description. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
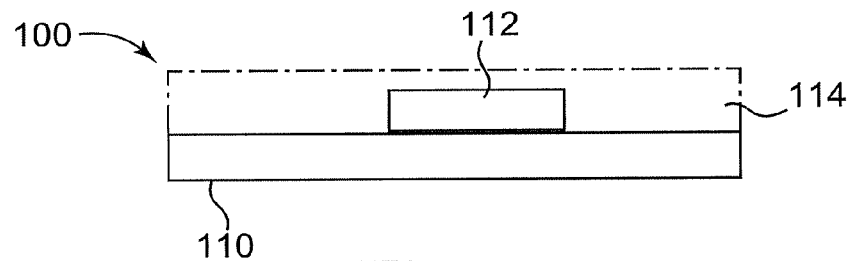
FIG. 1 is a side view conceptually illustrating an embodiment of a semiconductor device package.

FIG. 1 is a cross-sectional view conceptually illustrating one embodiment of an integrated circuit semiconductor package 100. The illustrated device 100 includes a chip carrier 110, with one or more semiconductor devices or chips 112 mounted on the carrier 110. The semiconductor chip 112 is mounted to the lead frame 110 by a diffusion soldering process in the illustrated embodiment. The assembled device 100 is typically encapsulated in a mold compound 114 to form the package. The chip carrier 110 can, for example, be the chip island of a lead frame or a substrate carrying the chip.

Figure 2:
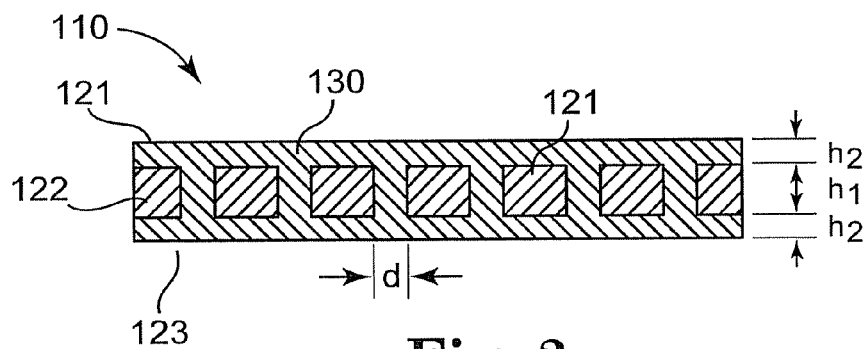
FIG. 2 is a cross section side view conceptually illustrating a portion of an embodiment of a chip carrier.

FIG. 2 illustrates a section view of the chip carrier 110 in accordance with an embodiment. The illustrated chip carrier 110 is made up of a plurality of layers, including a first layer 121 formed of a first material, a second layer 122 formed of a second material, and a third layer 123 formed of a third material. The second layer 122 has a plurality of holes, or vias 130 extending therethrough, with a fourth material 124 filling the holes 130 and connected to the first layer 121 and the third layer 123. The semiconductor device 112 (not shown in FIG. 2) is soldered to one of the outer layers 121 or 123.

Depending on the particular application for the carrier 110, at least the second material 122 can be electrically insulating. For applications having vertical current flow through the carrier 110, the first material 121, the via filling (fourth material 124) and the third material 123 need to be electrically conducting. If vertical current flow is not required, the via filling material 124 and the lower, or third, layer 123 can be insulating. Moreover, if the carrier is used for non-conductive applications (for example, the chip 112 is attached with an insulating glue), the top layer 121 can also be insulating.

The second layer 122 is made of a material having a relatively low coefficient of thermal expansion (CTE) as compared to the materials of the first and third layers 121, 123, while the first and third layers 121, 123 are made of materials having a relatively high thermal conductivity as compared to the material of the second layer 122. In general, the CTE of the second material is smaller than that of the first, third and fourth materials, and the thermal conductivity of at least one of the first material, the third material and the fourth material is larger than the thermal conductivity of the second material. Thus, the first layer, to which the semiconductor device 112 is connected, has good heat conductivity and soldering characteristics, while the middle second layer 122 expands and contracts less as a result of the diffusion soldering process.

The materials making up the first and third layers 121,123 and the fourth material 124 filling the holes 130 are all the same material in some embodiments, with a suitable material being copper. The thermal conductivity of the first and third layers 121,123 and the fourth material 124 filling the holes 130 should be the maximum achievable. Copper provides the desired heat conductivity, having a thermal conductivity of 401 W/(m·K). In general, a material having a thermal conductivity larger than 50 W/(m·K) is suitable for the first, third and/or fourth material.

A suitable material for the second layer 122, for example, is a nickel iron alloy known as Alloy 42 having a nickel content of about 42%. The CTE of Alloy 42 is $1.2*10^{-6}$/K, which is about the same as the CTE of silicon, making it particularly suitable for chip carrier material. In general, a material having a CTE on the order of silicon is desirable, and a material having a CTE smaller than $12*10^{-6}$/K is suitable for the first, third and/or fourth material.

Hence, the disclosed lead frame has a greater thermal conductivity than a lead frame constructed solely from a material such as Alloy 42, and a smaller CTE than a lead frame constructed solely of copper.

Figure 3:
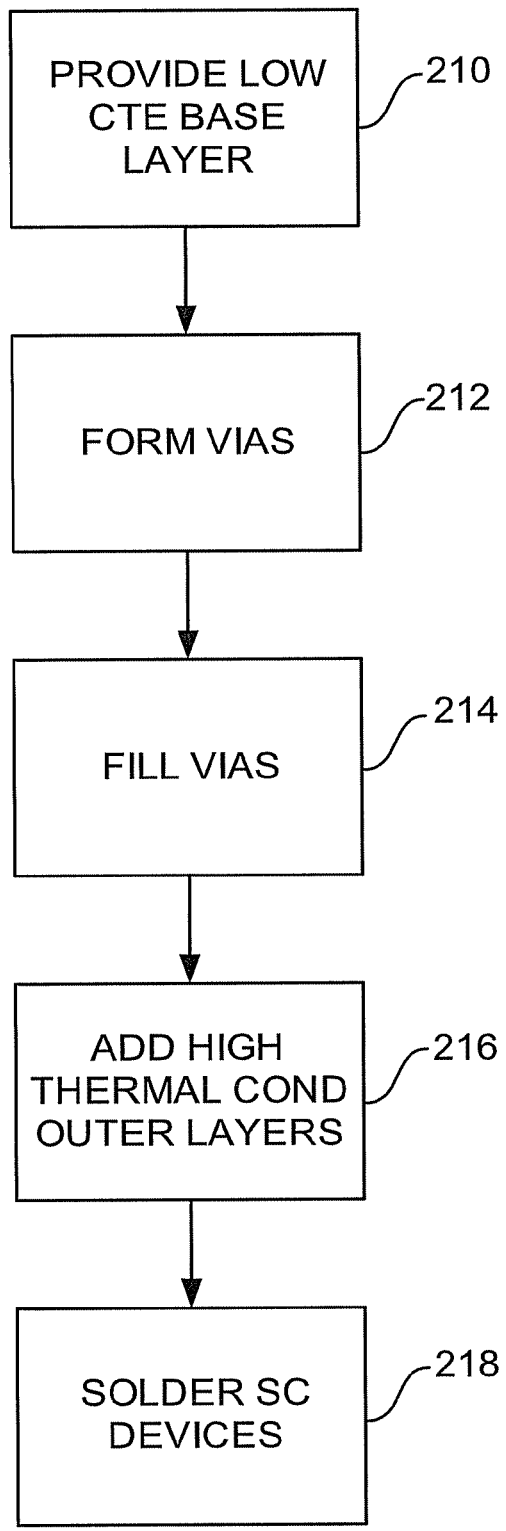
FIG. 3 is a flow diagram illustrating an embodiment of a process for manufacturing a semiconductor device package.

FIG. 3 is a flow diagram conceptually illustrating a process for assembling an embodiment of the chip carrier 110, and FIGS. 4A-4E illustrate the carrier 110 in various stages of manufacture. In block 210, the base layer (second layer 122) is provided. As noted above, the layer 122 has a relatively low CTE, thus preventing a large change in the desired positions for placement of the semiconductor devices 112. In the embodiment illustrated in FIG. 2, the second layer 122 is made from Alloy 42.

Figure 4A:
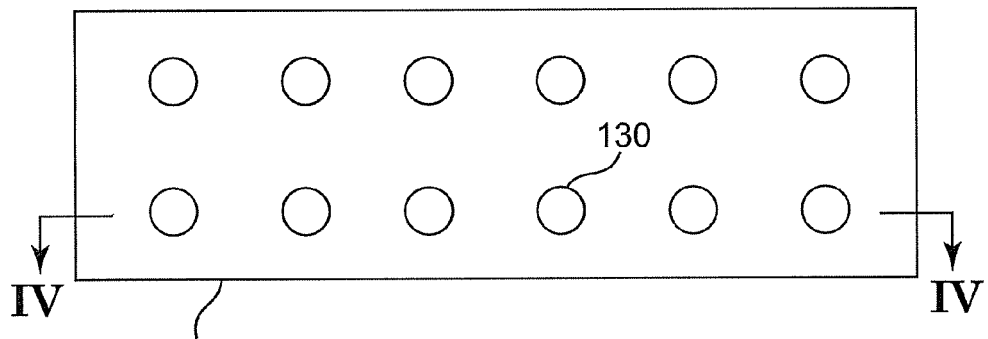
FIGS. 4A-4E illustrate the chip carrier of FIG. 2 in various stages of manufacture.
Figure 4B:
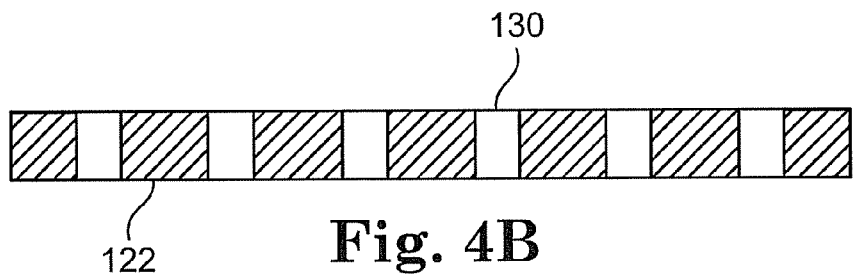
Figure 4C:
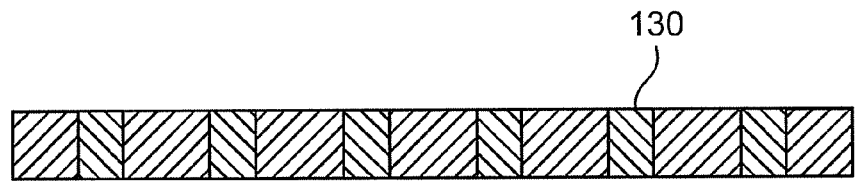

In block 212, the vias 130 are formed through the layer 122. In example processes, the vias 130 are cylindrical and are formed using a laser or by an etching process. FIG. 4A is a top view and FIG. 4B is a section view taken along line IV-IV of the second layer 122 with vias 130 formed therein. In block 214, the vias 130 are filled with the fourth material 124, which is copper in the illustrated embodiment. FIG. 4C illustrates the second layer 122 with the filled vias 130. An electrochemical process is used, for example, to fill the holes 130 with copper. In general, any physical or chemical deposition process providing enough mobility to the copper atoms to move into the vias 130 and fill them is suitable, including galvanic processes, physical vapor deposition processes, chemical vapor deposition processes, chemical reactions, cold or hot rolling processes, etc.

Figure 4D:
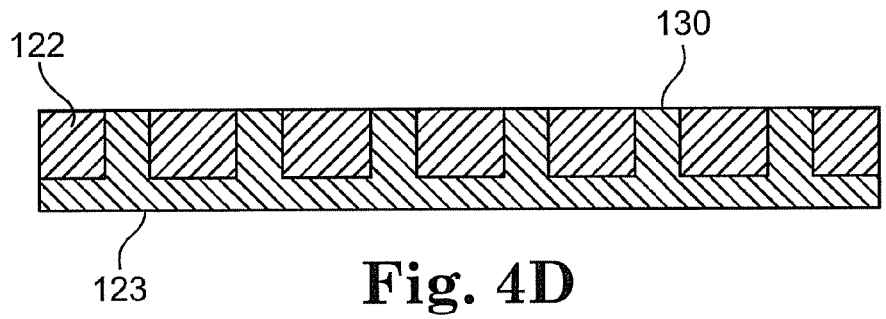
Figure 4E:
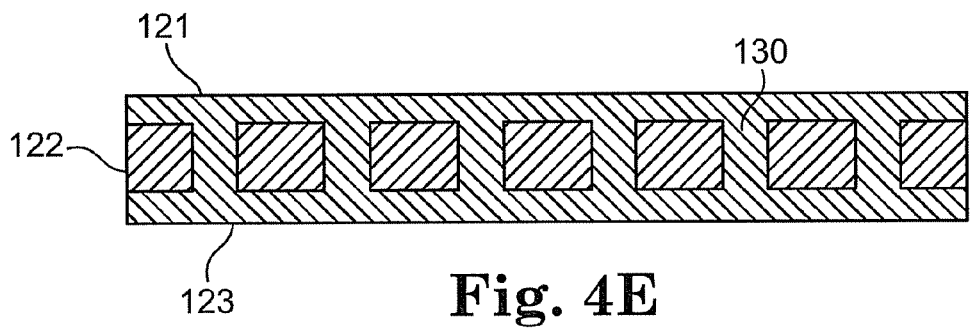

The outer layers (first and third layers 121, 123) are then applied on either side of the second layer 122, as illustrated in block 216. FIGS. 4D and 4E illustrate the addition of the third layer 123 and first layer 121, respectively. As noted above, in the illustrated embodiment, the first and third materials making up the first and third layers 121, 123 are both copper, which is applied by a plating process, for example.

After completion of the lead frame 110, semiconductor chips 112 are soldered to the lead frame 110 in block 218. Standard additional processes for completing electrical connections, encapsulation, testing, etc. are subsequently performed.

Since the completed lead frame 110 is symmetrical—a copper layer is on either side of the second layer 122 formed from Alloy 42—the lead frame 110 does not bow as with some prior art lead frames having an asymmetrical construction, for example, with only a single copper layer.

Figure 7:
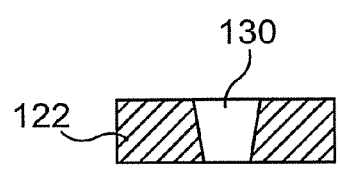
FIG. 7 illustrates an alternative via shape.
Figure 5:
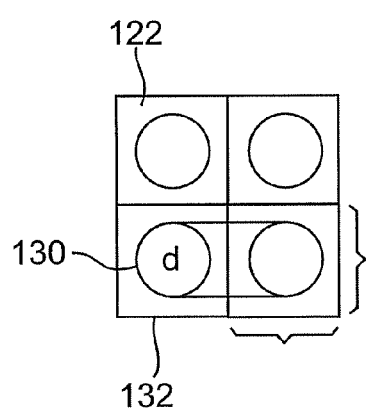
FIG. 5 is a partial top view illustrating a portion of the chip carrier of FIG. 2.
Figure 6:
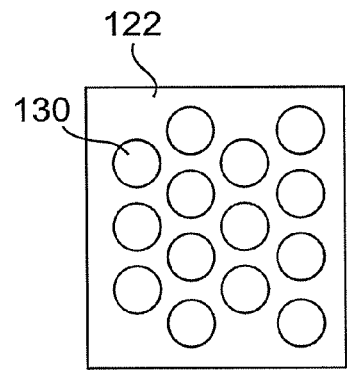
FIG. 6 is a partial top view illustrating an alternative via pattern.

In one embodiment, the second layer 122 formed from Alloy 42 is about 50 μm thick ($h_1$) and the first and third layers 121,123 are each about 150 μm thick ($h_2$). FIG. 5 is a partial top view of the second layer 122 of the lead frame 110, illustrating an example of portion of the array of vias 130 extending therethrough. A matrix of areas 132 is distributed about the surface of the second layer 122, with each area 132 being 1 mm square in the illustrated embodiment. In other embodiments, the diameter d of the vias 130 varies from about 0.2 mm to about 0.8 mm to achieve the desired CTE. FIG. 6 is a partial top view of another embodiment of the second layer 122, where every-other row of vias 130 is shifted to achieve greater via coverage. Further, FIG. 2 illustrates generally cylindrical vias 130. Other embodiments are envisioned where other via geometries are employed. For example, FIG. 7 illustrates a portion of the second layer 122 with vias 130 having angled sides, resulting in a truncated cone-shaped via 130.

Figure 8:
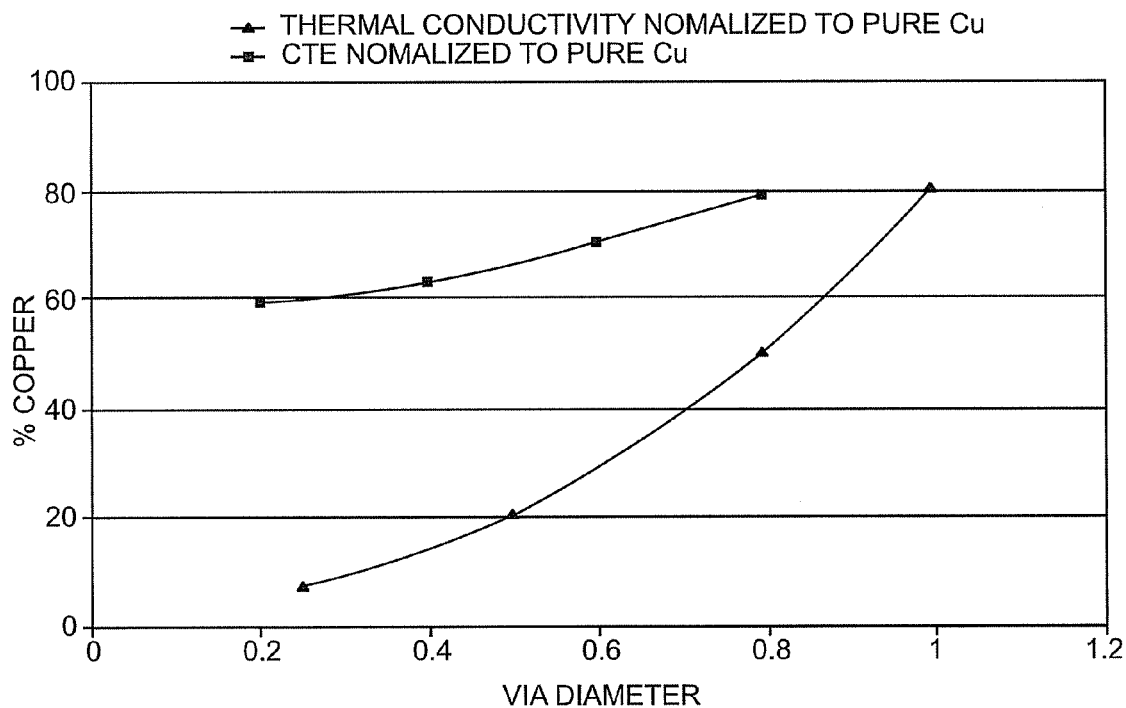
FIG. 8 is a chart illustrating thermal conductivity and CTE normalized to pure copper for embodiments of a chip carrier.

FIG. 8 is a chart illustrating thermal conductivity and CTE normalized to pure copper for embodiments of the lead frame 110 as disclosed above with these varying diameters of the vias 130.

Figure 9:
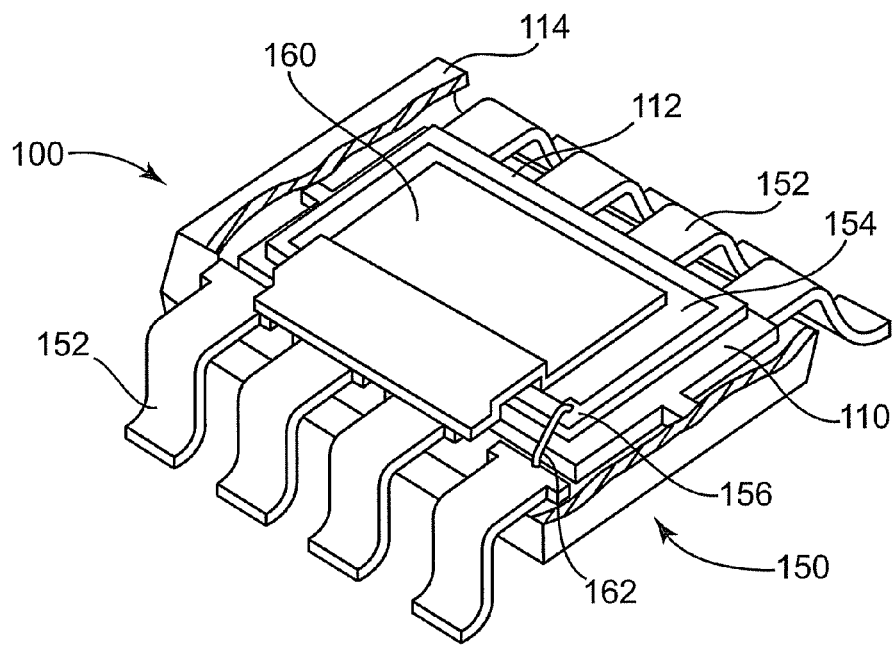
FIG. 9 is a perspective view illustrating an embodiment where the chip carrier is a chip island of a lead frame for a power semiconductor device.

FIG. 9 illustrates an embodiment of the package 100 in which the carrier 110 is a chip island of a lead frame 150 for a power semiconductor device. In the example illustrated, the chip 112 is a vertical power chip with contact areas coupled to leads 152 of the lead frame 150. The power chip 112 has a drain contact on the bottom of the chip 112 that is received by the top side of the carrier 110. In some embodiments, the drain contact is diffusion soldered to the carrier 110. Contact areas for a source contact 154 and gate contact 156 are situated on the top side of the chip 112, and the contact areas are coupled to selected ones of the leads 152. In the illustrated embodiment, the source contact 154 is connected to its respective leads 152 by a clip 160, which is typically attached by soldering or a conductive glue. The gate contact 156 is connected to its respective lead 152, for example, by a wirebond 162.

Thus, the reduced CTE resulting from the novel construction of the lead frame 110 leads to reduced stress in the package, while maintaining an adequate thermal conductivity by the copper-filled through holes. The reduced CTE further enables increased placement accuracy of devices on the lead frame 110 during the die attach process, since the placement positions vary less in the hot and cold states.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:
1. A semiconductor device, comprising:
 a carrier, including:
  a first layer formed of a first material;

a second layer formed of a second material and having a plurality of holes extending therethrough and distributed in an essentially uniform pattern throughout the second layer;

a third layer formed of a third material;

a fourth material filling the holes and connected to the first layer and the third layer;

a semiconductor chip soldered to the first layer;

wherein the coefficient of thermal expansion of the second material is smaller than that of the first, third and fourth materials;

wherein the thermal conductivity of at least one of the first material, the third material and the fourth material is larger than the thermal conductivity of the second material; and wherein the second layer has a thickness of approximately 50 μm.

2. The semiconductor device of claim 1, wherein the coefficient of thermal expansion of the second material is smaller than $12*10^{-6}$/K.

3. The semiconductor device of claim 1, wherein the thermal conductivity of at least one of the first material, the third material and the fourth material is larger than 50 W/(m·K).

4. The semiconductor device of claim 1, wherein at least two of the first, third and fourth material are of the same material.

5. The semiconductor device of claim 1, wherein the first and third layers define about the same thickness.

6. The semiconductor device of claim 1, wherein at least one of the first, third and fourth layer comprises copper.

7. The semiconductor device of claim 1, wherein the second material comprises an alloy including about 42% Nickel.

8. The semiconductor device of claim 1, wherein the semiconductor chip is diffusion soldered to the first layer.

9. The semiconductor device of claim 1, wherein the holes are generally cylindrical.

10. The semiconductor device of claim 1, further comprising a lead frame having leads, and wherein:

the carrier is a chip island; and the semiconductor chip has contacts coupled to the leads of the lead frame.

11. The semiconductor device of claim 10, wherein the semiconductor chip is a power chip having a drain contact on one side of the chip and source and gate contacts on an opposite side of the chip, and wherein:

the chip island is a contact land for contacting the drain contact;

the source contact is connected to one of the leads by a clip; and the gate contact is connected to one of the leads by a wire bond.

12. The semiconductor device of claim 11, wherein the drain contact is diffusion soldered to the chip island.

13. The semiconductor device of claim 1, wherein the first and the third material are electrically insulating.

14. A chip carrier, comprising:

first, second and third layers, the second layer being situated between the first and third layers; and wherein:

the first and third layers are formed of a first material;

the second layer is formed of a second material;

the second layer has a plurality of holes extending therethrough; the first material fills the holes; and the second material is Alloy 42.

15. The chip carrier of claim 14, wherein the coefficient of thermal expansion of the second material is smaller than that of the first material.

16. The chip carrier of claim 14, wherein the thermal conductivity of the first material is larger than the thermal conductivity of the second material.

17. The chip carrier of claim 14, wherein the first material is copper.

18. The chip carrier of claim 14, wherein the diameter of the holes is in the range of 0.2 mm to 0.8 mm.

* * * * *